(12) United States Patent
Kaviani

(10) Patent No.: US 7,190,196 B1
(45) Date of Patent: Mar. 13, 2007

(54) DUAL-EDGE SYNCHRONIZED DATA SAMPLER

(75) Inventor: Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 54 days.

(21) Appl. No.: 11/015,322

(22) Filed: Dec. 17, 2004

(51) Int. Cl.
H03L 7/00 (2006.01)
(52) U.S. Cl. ......................................... 327/141; 327/91
(58) Field of Classification Search ............ 327/91–97, 327/141, 142, 201–204, 233, 218; 375/355
See application file for complete search history.

(56) References Cited

U.S. PATENT DOCUMENTS

2002/0168043 A1* 11/2002 Sander ........................ 375/355

OTHER PUBLICATIONS

U.S. Appl. No. 11/015,674, filed Dec. 17, 2004, Kaviani.
U.S. Appl. No. 10/837,186, filed Apr. 30, 2004, Morrison et al.
U.S. Appl. No. 10/954,889, filed Sep. 29, 2004, Kaviani et al.
Xilinx, Inc.; "Virtex-II Platform FPGA Handbook"; published Dec. 2000; available from Xilinx, Inc., 2100 Logic Drive, San Jose, California 95124; pp. 161-183.

* cited by examiner

*Primary Examiner*—Linh My Nguyen
(74) *Attorney, Agent, or Firm*—Justin Liu

(57) ABSTRACT

A dual-edge synchronized sampler having an efficient implementation for high speed and high performance operation is described. The sampler receives a data input signal and a clock input signal and uses an asynchronous level mode state machine to sample the data input signal responsive to level changes in the clock input signal. In some embodiments, the sampler includes at least one differential logic block for implementing the asynchronous level mode state machine. The sampler has symmetric clock-to-Q propagation delays for both rising and falling edges of the clock input signal. The sampler may include toggle functionality, and may include edge control logic for configuring the sampler as one of a rising edge and falling edge sampler.

18 Claims, 6 Drawing Sheets

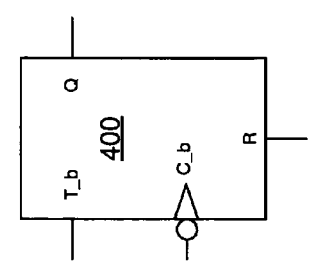
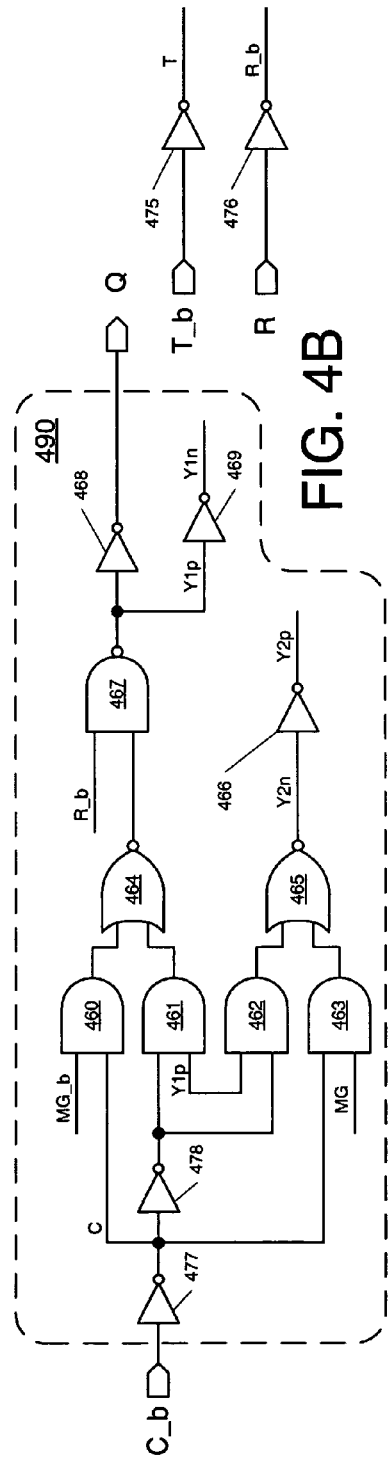
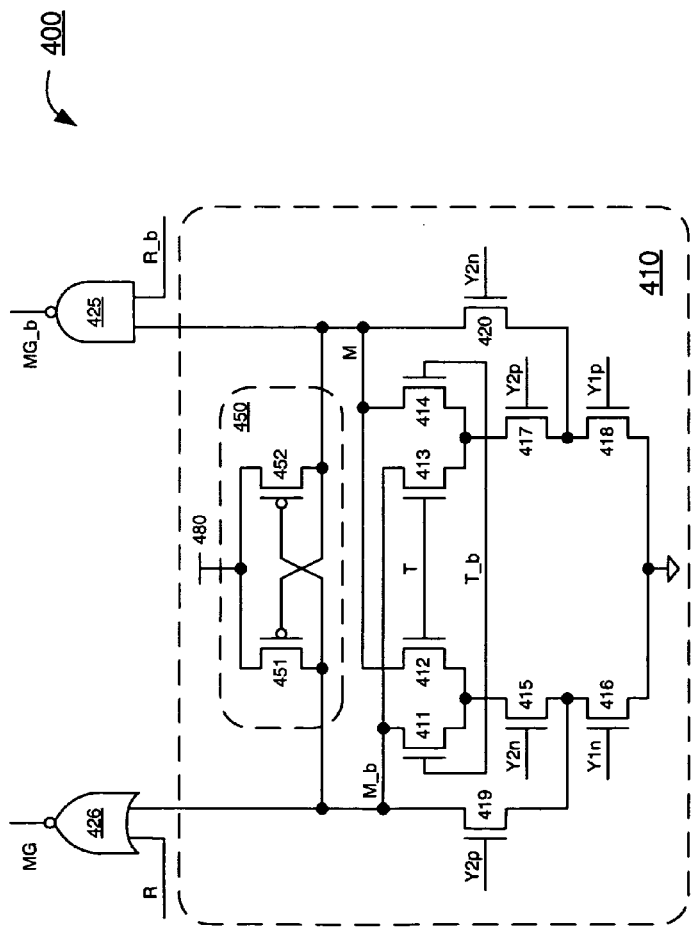
FIG. 4A
FIG. 4B

DUAL-EDGE SYNCHRONIZED DATA SAMPLER

FIELD OF THE INVENTION

The invention relates to sampler circuits, and more particularly, to a dual-edged synchronized data sampler.

BACKGROUND OF THE INVENTION

One of the critical challenges for circuit designers is managing timing of their designs. Precise control over timing and clock signals can enable higher performance and more reliable designs. This challenge to manage timing, however, has become greater as circuits grow more complex and clock frequencies increase.

Dual or double data rate (DDR) applications and designs have become increasingly popular as clock rates continue to increase into the gigahertz range and beyond. At very high frequencies, distributing an accurate, jitter-free clock becomes increasingly difficult. A double data rate application mitigates this problem by using both rising and falling edges of a clock. Thus, a DDR application only requires a clock having half the frequency of the corresponding data rate. DDR interfaces are commonly used for memory interfaces, as well as many other applications.

Conventional DDR techniques typically use 2 or more conventional flip-flops to obtain the desired functionality. For instance, a simple DDR input may include two standard edge-triggered flip-flops. One flip-flop may be configured to latch data on rising edge and the other may be configured to latch data on falling edges. In some instances, an inverted clock may be provided to a rising edge-triggered flip-flop to provide falling edge functionality. The DDR data stream would then be provided to the input of both latches.

Conventional DDR circuits, however, may have certain disadvantages. As noted above, a conventional DDR interface includes at least two separate flip-flops, thereby occupying greater area than single data rate (SDR) interfaces, which may only have one flip-flop. Furthermore, conventional DDR circuits may not be capable of operating at the high speeds required by many modern applications. Also, a conventional DDR circuit can introduce asymmetry or other errors in a design.

Accordingly, there is a need for a dual-edge sampler that addresses these and other shortcomings of conventional DDR circuits.

SUMMARY OF THE INVENTION

A sampling circuit for sampling an data signal responsive to a clock signal is described. An exemplary embodiment includes a dual-edge sampler having a clock terminal for receiving the clock signal, a data input terminal for receiving the data signal, an output terminal for providing an output signal, and an asynchronous level mode state machine configured to sample the data signal at every edge of the clock signal and provide sampled data as the output signal. In some embodiments, the asynchronous level mode state machine may include one or more differential logic blocks for generating one or more intermediate results responsive to current state information and the data signal. In some embodiments, the sampling circuit may have a toggle function. In some embodiments the sampling circuit may include edge control logic for selectively configuring the sampler as a rising edge or falling edge triggered sampler responsive to an edge control signal.

Additional novel aspects and embodiments are described in the detailed description below. The appended claims, and not this summary, define the scope of the invention.

BRIEF DESCRIPTION OF THE DRAWINGS

The present invention is illustrated by way of example, and not by way of limitation, in the following figures, in which like reference numerals refer to similar elements.

FIGS. 4A and 4B show a toggle sampler and a schematic diagram of the toggle sampler in accordance with an embodiment of the present invention.

DETAILED DESCRIPTION

The present invention is believed to be applicable to a variety of integrated circuits and designs, including clock management circuits and memory interfaces. While the present invention is not so limited, an appreciation of the present invention is presented by way of specific examples. The specific details are set forth to provide a more thorough understanding of the present invention. However, it will be apparent to one ordinarily skilled in the art that the present invention can be practiced without these specific details. In other instances, well-known circuits and devices may be omitted or presented in abstract form in order to avoid obscuring the present invention.

Figures 1A, 1B:
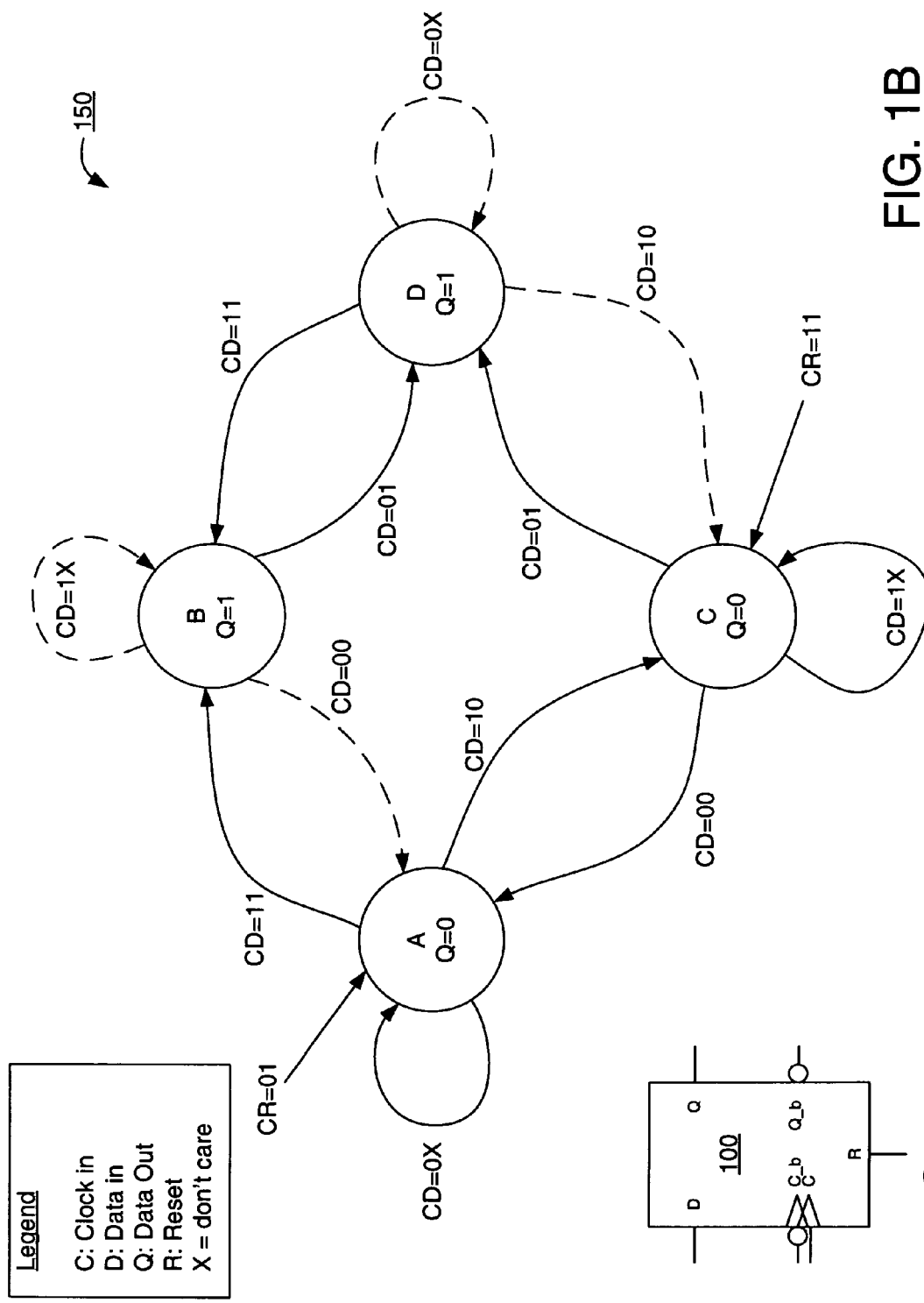
FIGS. 1A and 1B show a dual edge sampler and a state diagram of the dual-edge sampler in accordance with an embodiment of the present invention.

FIGS. 1A and 1B show a dual edge sampler 100 and a state diagram 150 of the dual-edge sampler in accordance with an embodiment of the present invention. As described in greater detail below, sampler 100 may be implemented as an asynchronous level mode state machine. In some embodiments, part or all of sampler 100 may include differential logic, such as differential cascode voltage switch logic (DCVSL). Sampler 100 includes input signals C and D corresponding to clock and data input signals, respectively, and an output signal Q. In some embodiments, complementary or differential clock signals C and C_b may be inputs to sampler 100. Sampler 100 may optionally include a reset input signal R, and may optionally provide an inverted output signal Q_b. Sampler 100 samples the data input signal D at every clock edge (both rising and falling) of clock input signal C, and provides that sampled data as output Q.

The state machine 150 of sampler 100 generally operates as follows. While the logic level of clock input C does not change, sampler 100 maintains its current state, and thus maintains a constant output state for output signal Q. Upon a level change of clock input C, either from low to high or high to low, data input D is sampled and latched. The new state of output signal Q reflects the latched value of data input D. Sampler 100 then waits for the next level change in clock input C.

As shown in FIG. 1B, the state machine includes four states. State A corresponds to a state where the output signal Q is a logic low, and sampler 100 is waiting for a transition from logic low to logic high (e.g., a rising edge) at clock input C. State B corresponds to a state where the output signal Q is a logic high, and sampler 100 is waiting for a transition from logic high to logic low (e.g., a falling edge) at clock input C. State C corresponds to a state where the output signal Q is a logic low, and sampler 100 is waiting for a transition from logic high to logic low at clock input C to trigger a state change. State D corresponds to a state where the output signal Q is a logic high, and sampler 100 is waiting for a transition from logic low to logic high at clock input C. Upon detection of the appropriate transition at clock input C in each of states A–D, sampler 100 latches the data input D and moves to the appropriate state that has an output signal Q corresponding to the latched data input and that is waiting for an opposite transition at clock input C.

Sampler 100 may further include a reset input signal R for resetting the state machine. In some embodiments, the reset signal may be an asynchronous reset that forces sampler 100 to a reset state, such as state A or state C, when the reset signal is asserted. For instance, the reset signal R may reset state machine 150 to one of state A and state C (both corresponding to a logic log output Q) depending on the logic level of clock input signal C. Thus, state machine 150 may be reset to the appropriate state such that sampler 100 will be ready for the next clock edge when the reset signal R is de-asserted or released.

Furthermore, in certain applications, sampler 100 may be optimized by eliminating transitions denoted by the dashed lines in FIG. 1B. By eliminating the dashed transitions, states B and D can only be exited by asserting the reset signal R. That is, once the state machine enters either state B or D, indicating that a logic high data input signal has been sampled, the optimized sampler stops further sampling until the state machine is reset.

An optimized sampler may be useful, for example, for applications where once sampler 100 latches a logic high data input (e.g., indicating that a desired event has occurred) future changes in the data input signal may be safely ignored until the state machine is reset. For instance, sampler 100 may be coupled to a comparator that detects a match between two inputs and asserts a match signal. The match signal may then be sampled by sampler 100. Thus, sampler 100 may stop sampling once a match has been detected. Therefore, the transitions for transitioning from states B and D, where the Q output signal is a logic high, to states A and C, where the Q output signal is a logic low, are not needed, so long as a reset signal is available for resetting the sampler (e.g., to one of states A or C). Another example of an application in which such an optimized sampler may be suitable is described in commonly assigned co-pending U.S. patent application entitled "Counter-Controlled Delay Line" by Alireza S. Kaviani, filed on the date hereof, which is incorporated by reference herein in its entirety. This optimization may result in a more efficient circuit that may occupy less area as will be described below in connection with FIG. 3.

Figure 2:
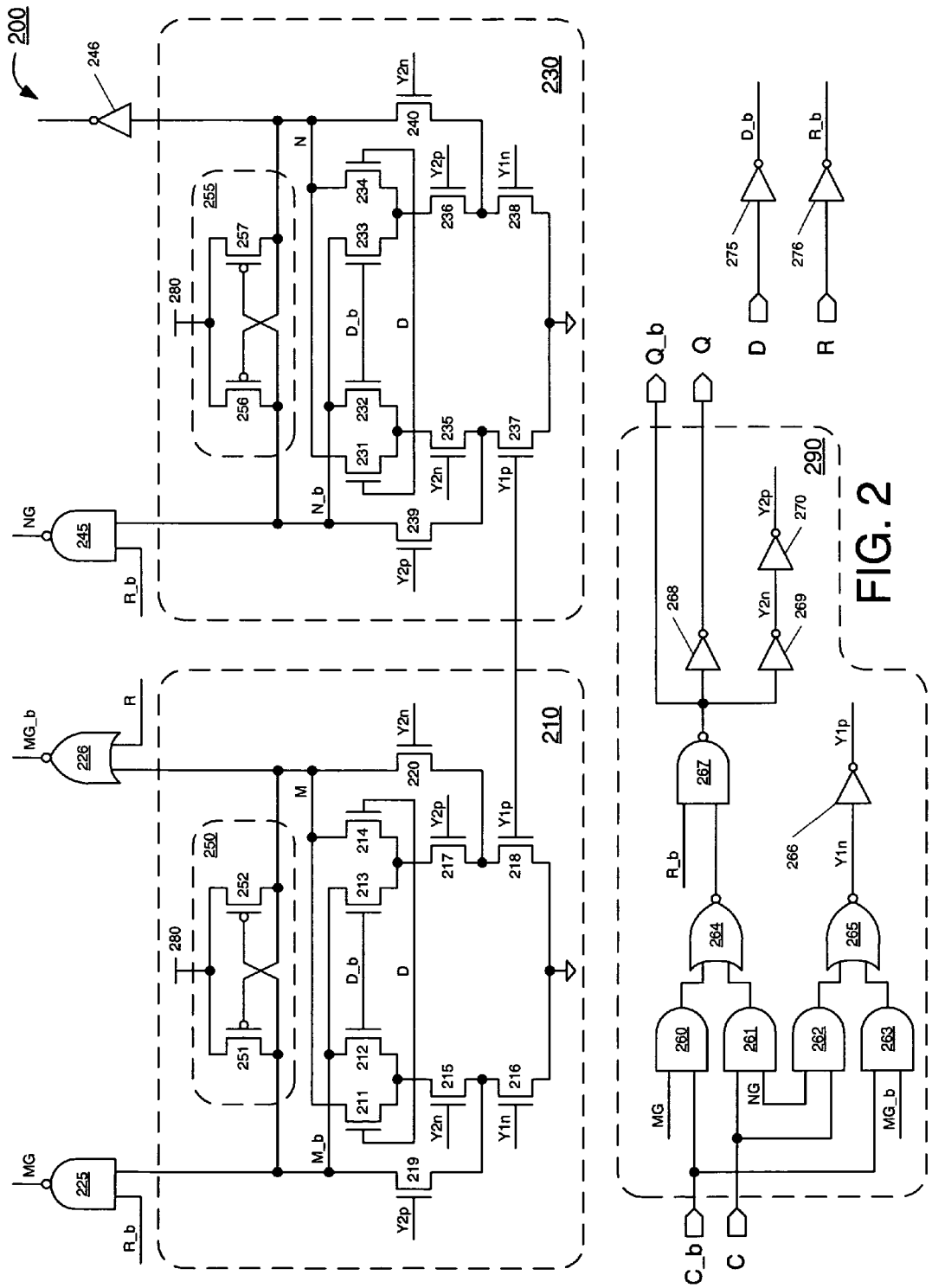
FIG. 2 shows a schematic diagram of a dual-edge sampler in accordance with an embodiment of the present invention.

FIG. 2 shows a schematic diagram of a dual-edge sampler 200 in accordance with an embodiment of the present invention. Dual-edge sampler 200 is an embodiment of sampler 100 and receives a data input signal D, complementary clock signals C and C_b, and a reset input signal R, and produces complementary output signals Q and Q_b. Dual-edge sampler 200 is generally an embodiment of state machine 150. Dual-edge sampler 200 includes two differential logic blocks 210 and 230 for implementing logic functions, and logic block 290 for generating next state information.

As shown in FIG. 2, each of differential logic blocks 210 and 230 provides a logic function based on differential signals Y1, Y2, and data input D and its complement signal D_b to produce differential intermediate results M and N. Note that Y1$p$ and Y1$n$ correspond to the positive and negative portions of differential signal Y1, and Y2$p$ and Y2$n$ correspond to the positive and negative portions of differential signal Y2. Differential logic blocks 210 and 230 include differential loads 250 and 255. In some embodiments, differential loads 250 and 255 may include cross-coupled PMOS transistors 251–252 and 256–257, respectively. Differential logic block 210 produces intermediate result M and its complement M_b. Intermediate result M may be gated by reset signal R via a NOR gate 226 to provide gated intermediate result MG_b, and intermediate result M_b may be gated by complement reset signal R_b via a NAND gate 225 to provide gated intermediate result MG. Signal R_b is the complement of reset signal R, and may be provided by an inverter 276. Similarly, intermediate result N_b may be gated by complement reset signal R_b via a NAND gate 245 to provide gated intermediate result NG. An inverter 246 may be coupled to intermediate result N provided by differential logic block 230 in order to balance loading of the outputs. The complement of data input D is signal D_b, which may be provided by an inverter 275. Differential logic block 210 may include NMOS transistors 211–220, and differential logic block 230 may include NMOS transistors 231–240, arranged as shown in FIG. 2 to provide particular logic functions. Table 1 indicates the logic truth table for the logic functions provided by differential logic blocks 210 and 230.

TABLE 1

| Y2p | Y1p | M   | N   |
|-----|-----|-----|-----|
| 0   | 0   | D_b | 0   |
| 0   | 1   | 0   | D_b |
| 1   | 0   | 1   | D_b |
| 1   | 1   | D_b | 1   |

Gated intermediate result signals MG, MG_b, and NG are provided along with input clock signals C and C_b to logic block 290 to generate the output signals Q and Q_b and the next state information. The current state of dual-edge sampler 200 is encoded in the states of signals Y1 and Y2. In particular, as shown in Table 2, each combination of Y1 and Y2 values corresponds to one of the four states A–D of state machine 150 described in connection with FIG. 1B. Furthermore, signal Y2$p$ corresponds to output signal Q_b, and likewise signal Y2$n$ corresponds to output signal Q. Input clock signal C_b is the complement of clock signal C, and in some embodiments may be provided by a differential clock source. In other embodiments, the complementary clock signals may be provided by an inverter. Logic block 290 includes AND gates 260–263, NOR gates 264–265, NAND gate 267, and inverters 266 and 268–270. Notably, the path from clock input C to the complementary outputs Q and Q_b passes through the same number of gates as the path from clock input C_b to outputs Q and Q_b. This means that dual-edge sampler 200 will have substantially symmetric clock-to-Q propagation delay for both rising and falling clock edges.

Table 2 is a truth table representation of the logic functions provided by logic blocks 210, 230, and 290. In Table 2, the "State" column indicates the corresponding state A–D of state machine 150, and the "Current Inputs" columns indicate the current state of sampler 200 (as indicated by signals Y1p and Y2p), and the values of data input signal D, clock input signal C, and reset signal R. The "Intermediate Result" columns indicate the values of signals M and N that are generated based on the given state and inputs of each row. Finally, the "Next State" columns indicate the next values of signals Y1p and Y2p, thereby indicating the next state transition. Note that the output signal Q corresponds to the Y2n signal (which is the complement of the Y2p signal).

TABLE 2

| State | Current Inputs | | | | | Intermediate Result | | Next State | |
|---|---|---|---|---|---|---|---|---|---|
| | Y1p | Y2p | D | C | R | M | N | Y1p | Y2p |
| B | 0 | 0 | 0 | 0 | 0 | 1 | 0 | 0 | 1 |
| | 0 | 0 | 0 | 1 | 0 | 1 | 0 | 0 | 0 |
| | 0 | 0 | 1 | 0 | 0 | 0 | 0 | 1 | 0 |
| | 0 | 0 | 1 | 1 | 0 | 0 | 0 | 0 | 0 |
| A | 0 | 1 | 0 | 0 | 0 | 1 | 1 | 0 | 1 |
| | 0 | 1 | 0 | 1 | 0 | 1 | 1 | 1 | 1 |
| | 0 | 1 | 1 | 0 | 0 | 1 | 0 | 0 | 1 |
| | 0 | 1 | 1 | 1 | 0 | 1 | 0 | 0 | 0 |
| D | 1 | 0 | 0 | 0 | 0 | 0 | 1 | 1 | 0 |
| | 1 | 0 | 0 | 1 | 0 | 0 | 1 | 1 | 1 |
| | 1 | 0 | 1 | 0 | 0 | 0 | 0 | 1 | 0 |
| | 1 | 0 | 1 | 1 | 0 | 0 | 0 | 0 | 0 |
| C | 1 | 1 | 0 | 0 | 0 | 1 | 1 | 0 | 1 |
| | 1 | 1 | 0 | 1 | 0 | 1 | 1 | 1 | 1 |
| | 1 | 1 | 1 | 0 | 0 | 0 | 1 | 1 | 0 |
| | 1 | 1 | 1 | 1 | 0 | 0 | 1 | 1 | 1 |
| | X | X | X | 0 | 1 | X | X | 0 | 1 |
| | X | X | X | 1 | 1 | X | X | 1 | 1 |

As shown in FIG. 2, differential logic blocks 210 and 230 may be implemented as DCVSL blocks. In other embodiments, other forms of logic may be used. In the embodiment illustrated in FIG. 2, differential logic blocks 210 and 230 have identical circuit topologies. Similar or identical topologies may be used to implement other types of flip-flops, samplers, and other sequential circuits. Furthermore, FIG. 2 shows logic block 290 implemented using single-ended logic. In other embodiments, logic block 290 may include differential logic gates. Differential logic may be used to achieve, for instance, better symmetry and higher performance at the possible expense of increased area and complexity. Note that the embodiment of dual-edge sampler 200 shown in FIG. 2 has a positive hold time. In some embodiments, dual-edge sampler 200 may additionally provide level shifting functionality to shift input signals having a first voltage range to an output signal having a different voltage range. For example, supply voltage 280 may be at a different voltage than the supply voltage of the circuits providing the inputs to dual-edge sampler 200. This allows separate power supplies to be used in different areas of a circuit.

Figure 3:
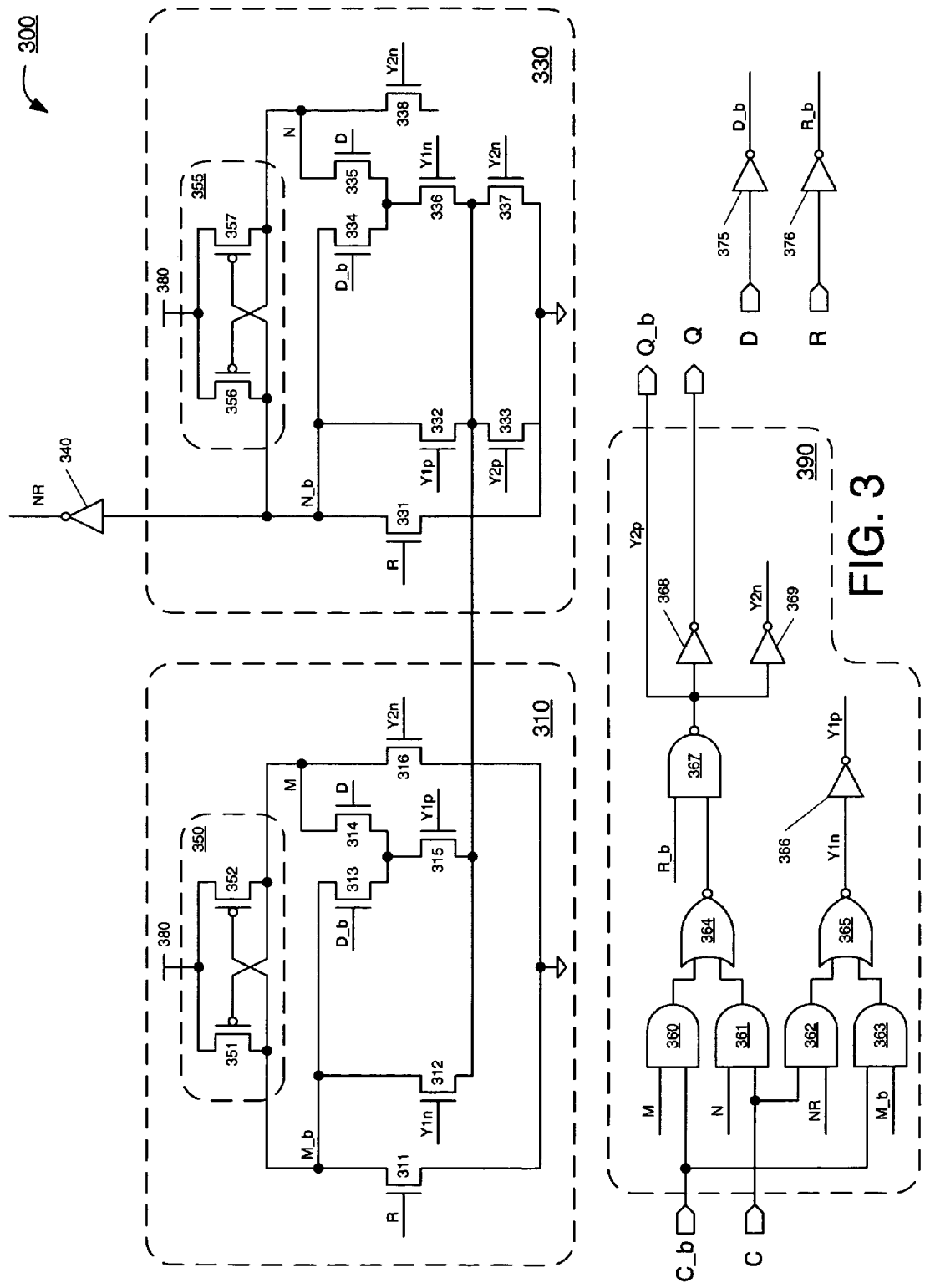
FIG. 3 shows schematic diagram of an optimized dual-edge sampler in accordance with an embodiment of the present invention.

FIG. 3 shows schematic diagram of an optimized dual-edge sampler 300 in accordance with an embodiment of the present invention. As noted above, the logic and circuitry of a dual-edge sampler may be optimized depending on the specific requirements of the application in which it is being used. In particular, optimized dual-edge sampler 300 corresponds to the state transition diagram of FIG. 1B without the dashed transitions. Thus, optimized dual-edge sampler 300 may be reset by reset signal R to one of states A and C (depending on the value of clock input C). In states A and C, the output Q of optimized dual-edge sampler 300 is a logic low. At each edge of clock input C, the data input D of optimized dual-edge sampler 300 is sampled. When a logic high is sampled at data input D, optimized dual-edge sampler 300 transitions to one of states B and D. Thereafter, it remains in states B and D, regardless of the value of data input D, and provides a constant logic high output Q until reset signal R is asserted. As can be seen in FIG. 3, optimizing a dual-edge sampler in this way results in a more efficient circuit that uses less logic and thus requires less area.

Optimized dual-edge sampler 300 includes differential logic blocks 310 and 330, which include differential loads 350 and 355, respectively. Note that differential logic blocks 310 and 330 have reduced complexity when compared to differential logic blocks 210 and 230 of dual-edge sampler 200. In particular, differential logic block 310 includes 6 NMOS transistors 311–316, and differential logic block 330 includes 8 NMOS transistors 331–338, as compared with 10 NMOS transistors for each of differential logic blocks 210 and 230. Differential logic block 310 generates an intermediate result M and its complement M_b, and differential logic block 330 generates an intermediate signal N. Differential logic block 330 also generates an intermediate signal NR that is logically equivalent to N and may be generated via an inverter 340. Signal R_b is the complement of reset signal R, and may be provided by an inverter 376. Similarly, the complement of data input D is signal D_b, which may be provided by an inverter 375. Table 3 indicates the logic truth table for the logic functions provided by differential logic blocks 310 and 330. Note that Y1p and Y1n correspond to the positive and negative portions of differential signal Y1, and Y2p and Y2n correspond to the positive and negative portions of differential signal Y2.

TABLE 3

| Y2p | Y1p | M | N |
|---|---|---|---|
| 0 | 0 | 0 | 0 |
| 0 | 1 | 0 | 0 |
| 1 | 0 | 1 | D_b |
| 1 | 1 | D_b | 1 |

Intermediate result signals M, M_b, N, and NR are provided along with input clock signals C and C_b to logic block 390 to generate the output signals Q and Q_b and the next state information. Similar to dual-edge sampler 200, the current state of optimized dual-edge sampler 300 is encoded in the states of signals Y1 and Y2. In particular, as shown in Table 4, each combination of Y1 and Y2 values corresponds to one of the four states A–D of state machine 150 described in connection with FIG. 1B. Furthermore, signal Y2p corresponds to output signal Q_b, and likewise signal Y2n corresponds to output signal Q. Input clock signal C_b is the complement of clock signal C, and in some embodiments may be provided by a differential clock source or by an inverter. Logic block 390 includes AND gates 360–363, NOR gates 364–365, NAND gate 367, and inverters 366, 368 and 369. Note that as with dual-edge sampler 200, the path from clock input C to the complementary outputs Q and Q_b is the same as the path from clock input C_b to outputs Q and Q_b for optimized dual-edge sampler 300. This means that optimized dual-edge sampler 300 will also have substantially symmetric clock-to-Q propagation delay for both rising and falling clock edges.

Table 4 is a truth table representation of the logic functions provided by logic blocks 310, 330, and 390. In Table 4, the "State" column indicates the corresponding state A–D (as described in connection with state machine 150), and the "Current Inputs" columns indicate the current state of optimized dual-edge sampler 300 (as indicated by signals Y1p and Y2p), and the values of data input signal D, clock input signal C, and reset signal R. The "Intermediate Result" columns indicate the values of signals M and N that are generated based on the given state and inputs of each row. Finally, the "Next State" columns indicate the next values of signals Y1p and Y2p, thereby indicating the next state transition. As noted above, output signal Q corresponds to the Y2n signal (which is the complement of the Y2p signal).

TABLE 4

| State | Current Inputs | | | | | Intermediate Result | | Next State | |
|---|---|---|---|---|---|---|---|---|---|
| | Y1p | Y2p | D | C | R | M | N | Y1p | Y2p |
| B | 0 | 0 | 0 | 0 | 0 | 0 | 0 | 1 | 0 |
| | 0 | 0 | 0 | 1 | 0 | 0 | 0 | 0 | 0 |
| | 0 | 0 | 1 | 0 | 0 | 0 | 0 | 1 | 0 |
| | 0 | 0 | 1 | 1 | 0 | 0 | 0 | 0 | 0 |
| A | 0 | 1 | 0 | 0 | 0 | 1 | 1 | 0 | 1 |
| | 0 | 1 | 0 | 1 | 0 | 1 | 1 | 1 | 1 |
| | 0 | 1 | 1 | 0 | 0 | 1 | 0 | 0 | 1 |
| | 0 | 1 | 1 | 1 | 0 | 1 | 0 | 0 | 0 |
| D | 1 | 0 | 0 | 0 | 0 | 0 | 0 | 1 | 0 |
| | 1 | 0 | 0 | 1 | 0 | 0 | 0 | 0 | 0 |
| | 1 | 0 | 1 | 0 | 0 | 0 | 0 | 1 | 0 |
| | 1 | 0 | 1 | 1 | 0 | 0 | 0 | 0 | 0 |
| C | 1 | 1 | 0 | 0 | 0 | 1 | 1 | 0 | 1 |
| | 1 | 1 | 0 | 1 | 0 | 1 | 1 | 1 | 1 |
| | 1 | 1 | 1 | 0 | 0 | 0 | 1 | 1 | 0 |
| | 1 | 1 | 1 | 1 | 0 | 0 | 1 | 1 | 1 |
| | X | X | X | 0 | 1 | 1 | 1 | 0 | 1 |
| | X | X | X | 1 | 1 | 1 | 1 | 1 | 1 |

As shown in FIG. 3, differential logic blocks 310 and 330 may be implemented as DCVSL blocks. In other embodiments, other forms of logic may be used. FIG. 3 also shows logic block 390 implemented using single-ended logic. In other embodiments, logic block 390 may include differential logic. Differential logic may be used to achieve, for instance, better symmetry and higher performance at the possible expense of increased area and complexity. Note that the embodiment of optimized dual-edge sampler 300 shown in FIG. 3 has a positive hold time. In some embodiments, optimized dual-edge sampler 300 may additionally provide level shifting functionality as described above with respect to dual-edge sampler 200.

FIG. 4A shows a toggle sampler 400, and FIG. 4B shows a corresponding schematic diagram of toggle sampler 400 in accordance with an embodiment of the present invention. As shown in FIG. 4A, toggle sampler 400 receives an active low toggle input T_b, a clock input C_b, and provides an output signal Q. In general, toggle sampler 400 samples input T_b on the falling edges of clock signal C_b, which correspond to rising edges of a complement clock signal C. If the sampled value of T_b is logic low (indicating that the toggle input is being asserted), the output Q is toggled from its current state. That is, if signal T_b is asserted when sampled, then if output signal Q is a logic high, it will switch to a logic low, and if output signal Q is a logic low, it will switch to a logic high. Otherwise, toggle sampler 400 maintains the current value of Q. Toggle sampler 400 may also receive a reset signal R for resetting to a known state (e.g., where the output Q is a logic low).

As shown in FIG. 4B, toggle sampler 400 includes a differential logic block 410 and a logic block 490. Differential logic block 410 includes NMOS transistors 411–420, and a differential load 450, which may include cross-coupled PMOS transistors 451 and 452. Differential logic block 410 generates an intermediate result signal M, and its complement M_b, based on input signals Y1p, Y1n, Y2p, Y2n, T and T_b. Note that signals Y1p and Y1n are positive and negative portions of a differential signal Y1, and that signals Y2p and Y2n are positive and negative portions of a differential signal Y2. Signal T is the complement of toggle input signal T_b, and may be provided by inverter 475. Intermediate results M_b and M may be gated by reset signal R (and its complement R_b, which may be provided by inverter 476) via NOR gate 426 and NAND gate 425 to provide gated intermediate result signals MG and MG_b, respectively. Table 5 indicates the logic truth table for the logic function provided by differential logic block 410.

TABLE 5

| Y2p | Y1p | M |
|---|---|---|
| 0 | 0 | T_b |
| 0 | 1 | 0 |
| 1 | 0 | 1 |
| 1 | 1 | T |

Signals MG, MG_b, Y1p and C_b are provided to logic block 490 to generate the output signal Q and the next state information. Note that the embodiment shown in FIGS. 4A and 4B only require a single clock input C_b, and a complement clock signal C may be generated internally via inverter 477. Other embodiments may have different clock signal arrangements. Similar to samplers 200 and 300, the current state of toggle sampler 400 is encoded in the states of signals Y1 and Y2. In particular, as shown in Table 6, each combination of Y1 and Y2 values corresponds to one of four states A–D. The state of signal Y1n corresponds to the output signal Q, thus as shown in Table 6, states A and C represent states where the output Q is a logic low, and states B and D represent states where the output Q is a logic high. In states A and D, toggle sampler 400 is waiting for a rising edge of clock signal C_b (i.e., a falling edge of complement clock signal C) to transition to the next state, and in states B and C, toggle sampler 400 is waiting for a falling edge of clock signal C_b. Logic block 490 includes AND gates 460–463, NOR gates 464–465, NAND gate 467, and inverters 466, 468, 469, 477 and 478.

Table 6 is a truth table representation of the logic functions provided by logic blocks 410 and 490. In Table 6, the "State" column indicates the corresponding state A–D (as described above with respect to toggle sampler 400), and the "Current Inputs" columns indicate the current state of toggle sampler 400 (as indicated by signals Y1p and Y2p), and the values of data input signal T (which is the complement of clock input T_b), clock input signal C (which is the complement of clock input C_b), and reset signal R. The "Intermediate Result" column indicates the values of signal M that are generated based on the given state and inputs of each row. Finally, the "Next State" columns indicate the next values of signals Y1p and Y2p, thereby indicating the next state transition. As noted above, output signal Q corresponds to the Y1 n signal (which is the complement of the Y1 p signal).

TABLE 6

| State | Current Inputs | | | | | Intermediate Result | Next State | |
|---|---|---|---|---|---|---|---|---|
| | Y1p | Y2p | T | C | R | M | Y1p | Y2p |
| B | 0 | 0 | 0 | 0 | 0 | 1 | 0 | 0 |
|   | 0 | 0 | 0 | 1 | 0 | 1 | 0 | 1 |
|   | 0 | 0 | 1 | 0 | 0 | 0 | 0 | 0 |
|   | 0 | 0 | 1 | 1 | 0 | 0 | 1 | 0 |
| D | 0 | 1 | 0 | 0 | 0 | 1 | 0 | 0 |
|   | 0 | 1 | 0 | 1 | 0 | 1 | 0 | 1 |
|   | 0 | 1 | 1 | 0 | 0 | 1 | 0 | 0 |
|   | 0 | 1 | 1 | 1 | 0 | 1 | 0 | 1 |
| A | 1 | 0 | 0 | 0 | 0 | 0 | 1 | 1 |
|   | 1 | 0 | 0 | 1 | 0 | 0 | 1 | 0 |
|   | 1 | 0 | 1 | 0 | 0 | 0 | 1 | 1 |
|   | 1 | 0 | 1 | 1 | 0 | 0 | 1 | 0 |
| C | 1 | 1 | 0 | 0 | 0 | 0 | 1 | 1 |
|   | 1 | 1 | 0 | 1 | 0 | 0 | 1 | 0 |
|   | 1 | 1 | 1 | 0 | 0 | 1 | 1 | 1 |
|   | 1 | 1 | 1 | 1 | 0 | 1 | 0 | 1 |
|   | X | X | X | 0 | 1 | X | 1 | 1 |
|   | X | X | X | 1 | 1 | X | 1 | 0 |

As shown in FIG. 4, differential logic block 410 may be implemented as a DCVSL block and logic block 490 may be implemented using single-ended logic. In other embodiments, other forms of logic may be used for one or both of logic blocks 410 and 490. As with samplers 200 and 300, toggle sampler 400 has a positive hold time. Also as with samplers 200 and 300, in some embodiments, toggle sampler 400 may additionally provide level shifting functionality by varying the power supply voltage 480.

Figure 5:
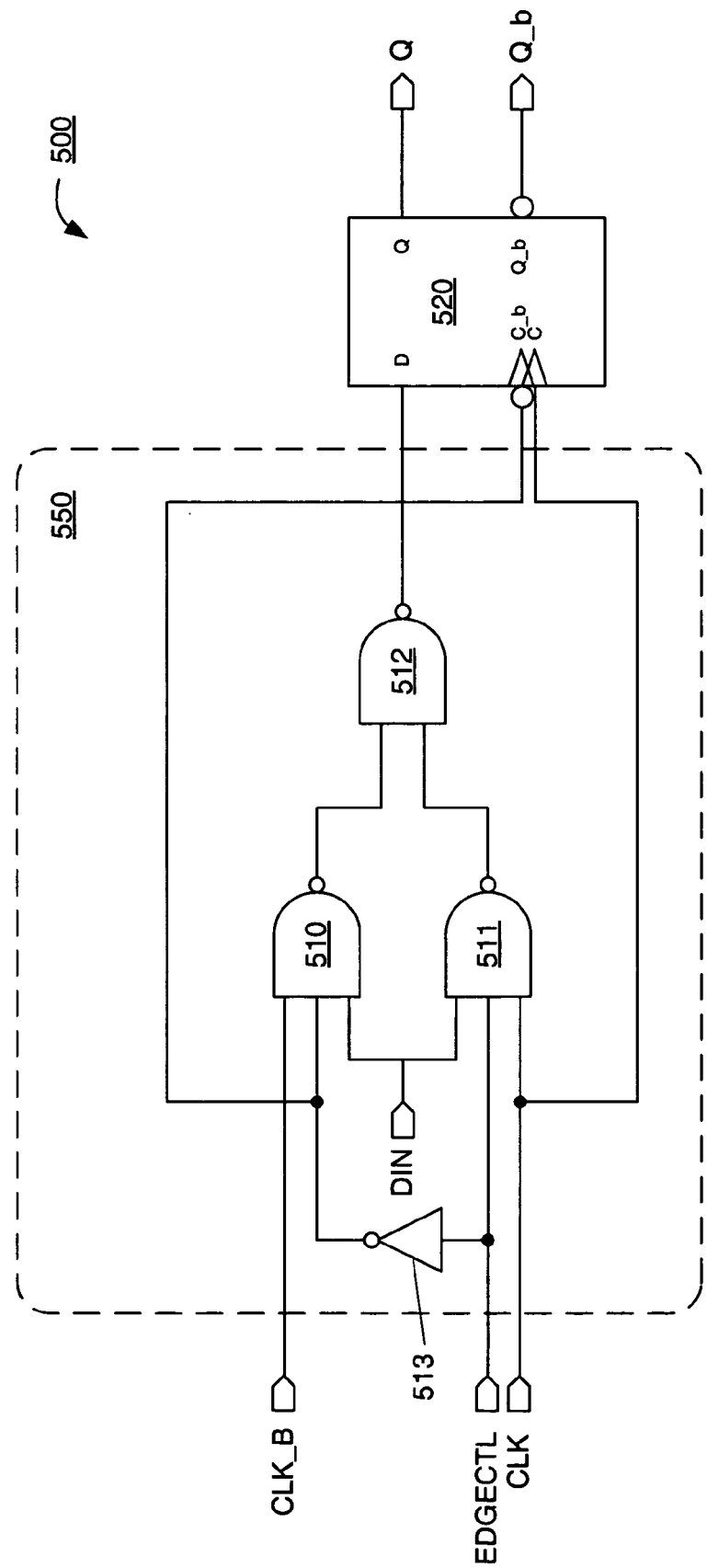
FIG. 5 shows a schematic diagram of a sampler with edge control in accordance with an embodiment of the present invention.

FIG. 5 shows a schematic diagram of a sampler 500 with edge control in accordance with an embodiment of the present invention. Sampler 500 includes a dual-edge sampler 520 and edge control logic 550. In some embodiments, dual-edge sampler may be implemented as sampler 200 or sampler 300. Edge control logic 550 provides logic for gating a data input signal DIN with either a clock input CLK or its complement CLK_B, depending on the value of control signal EDGECTL. The gated data input is provided to the D input of dual-edge sampler 520. Clock signals CLK and CLK_B are also provided to the C and C_b clock inputs, respectively, of dual-edge sampler 520.

By gating the data input DIN, a programmable D flip-flop is formed where the EDGECTL control signal determines whether sampler 500 acts as a rising edge-triggered flip-flop or a falling edge-triggered flip-flop. In particular, when EDGECTL is a logic low, sampler 500 acts as a rising edge-triggered flip-flop that samples data input DIN on rising edges of clock input CLK (and corresponding falling edges of clock input CLK_B). Conversely, when EDGECTL is a logic high, sampler 500 acts as a falling edge-triggered flip-flop that samples data input DIN on falling edges of clock input CLK (and rising edges of clock input CLK_B). Thus, dual-edge sampler 520 coupled with edge control logic 550 forms a programmable sampler. In some embodiments, EDGECTL may be provided from a memory cell, such as a configuration memory cell of a programmable logic device, from an output of another circuit, or from any internal or external signal.

Edge control logic 550 includes an inverter 513 with signal EDGECTL coupled as its input and an output that drives an input of a NAND gate 510. Clock signal CLK_B and data input signal DIN are also provided as inputs to NAND gate 510. Edge control logic 550 further includes a NAND gate 511 having control signal EDGECTL, clock signal CLK, and data input signal DIN as inputs. The outputs of NAND gates 510 and 511 drive inputs of a NAND gate 512, and the output of NAND gate 512 drives the D input of dual-edge sampler 520.

Figure 6:
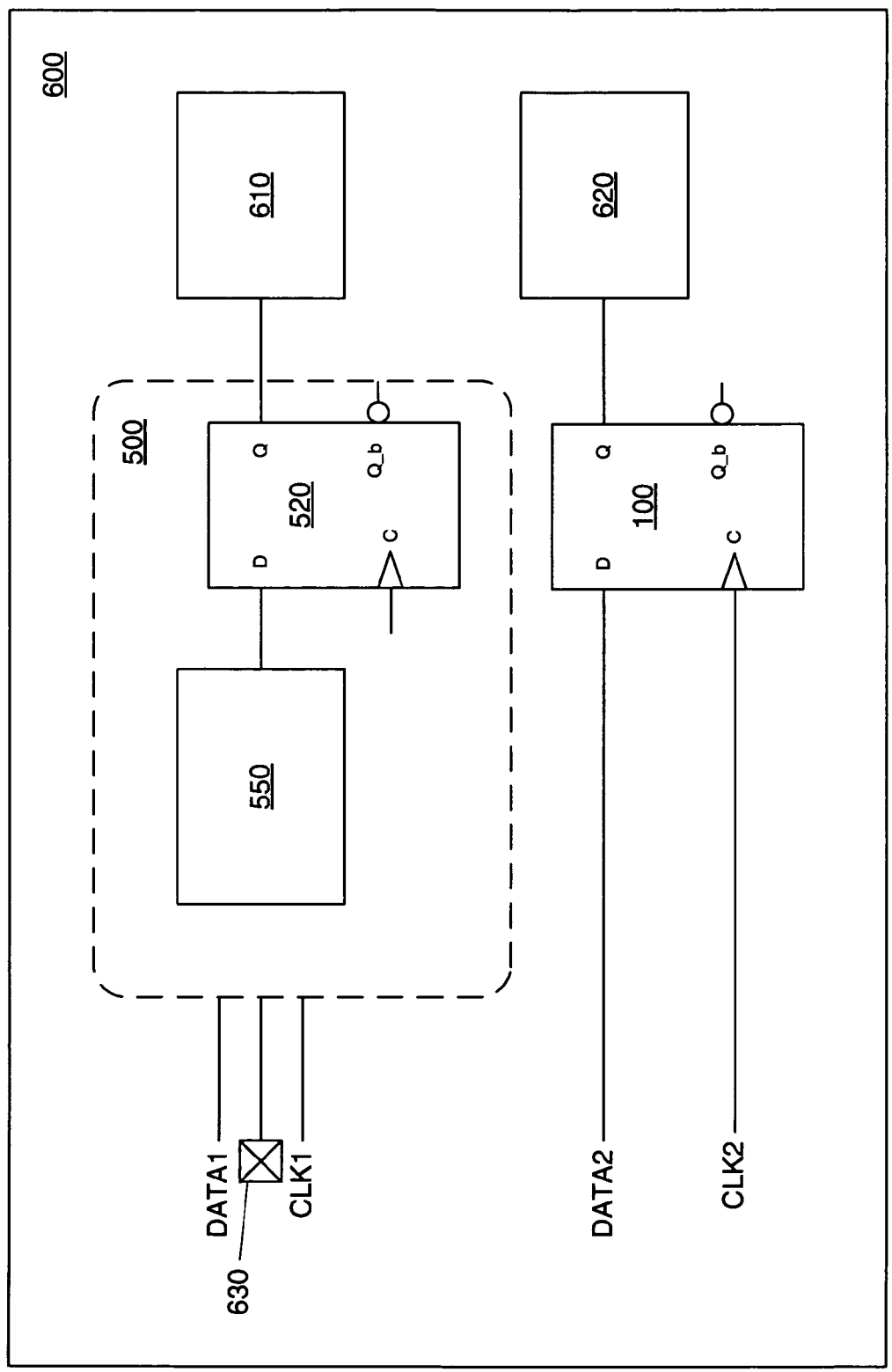
FIG. 6 shows a schematic diagram of an integrated circuit including samplers in accordance with an embodiment of the present invention.

FIG. 6 shows a schematic diagram of an integrated circuit 600 including samplers in accordance with an embodiment of the present invention. Integrated circuit 600 includes a sampler 500 having edge control, a dual-edge sampler 100, circuits 610 and 620, and memory cell 630. A data signal DATA1 is coupled to sampler 500 to provide a data stream. Memory cell 630 stores a memory bit that is provided to edge control logic 550 of sampler 500 to configure sampler 500 for operation as either a rising or falling edge-triggered flip-flop. A clock signal CLK1, which may be a differential clock, is also provided to sampler 500. An output of sampler 500 may be provided to a circuit 610 for further processing.

A second data signal DATA2, which may be a DDR data stream, is provided to the data input of dual-edge sampler 100. Sampler 100 also receives a clock signal CLK2, which may be a differential clock. Note that samplers 100 and 520 are shown in FIG. 6 with only one clock input for simplicity. In general, the clock inputs to the samplers may be single-ended or differential, and may therefore include one or more input terminals. The output Q of dual-edge sampler 100 may be provided to a circuit 620 for further processing. Although signals DATA1, CLK1, DATA2, and CLK2 of integrated circuit 600 are shown as internal signals, it is to be understood that one or more of the signals may be provided by an external source. Similarly, one or both of circuits 610 and 620 may be external to integrated circuit 600. In general, integrated circuit may be any device where samplers may be useful. In some embodiments, integrated circuit 600 may be a programmable device, such as an integrated circuit having programmable logic fabric, or a programmable logic device. One example of a programmable logic device is a field programmable gate array (FPGA). In such embodiments, memory cell 630 may be part of a configuration memory arrangement, and circuits 610 and 620 may include programmable logic.

Those having ordinary skill in the relevant arts of the invention will now perceive various modifications and additions that can be made as a result of the disclosure herein. For example, although certain circuits are described above as differential circuits, single-ended circuits having the same or similar functions may be substituted for those circuits, and vice versa.

Furthermore, capacitors, transistors, level shifters, PMOS transistors, NMOS transistors, and other components other than those described herein may be used to implement the invention. Active-high signals can be replaced with active-low signals by making straightforward alterations to the circuitry, such as are well known in the art of circuit design. Logic circuits can be replaced by their logical equivalents, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of ordinary skill in the art.

Accordingly, all such modifications and additions are deemed to be within the scope of the invention, which is defined only by the appended claims and their equivalents.

What is claimed is:

1. A dual-edge sampler comprising:
    a clock terminal for receiving a clock signal;
    a data input terminal for receiving a data signal;
    an output terminal for providing an output signal;
    an asynchronous level mode state machine configured to sample the data signal at every rising and falling edge of the clock signal and provide sampled data as the output signal; and
    an edge control circuit for selectively configuring the dual-edge sampler as a rising edge or falling edge triggered sampler responsive to an edge control signal.

2. The dual-edge sampler of claim 1 wherein the clock signal is a differential clock signal having a positive portion and a negative portion, and the clock terminal is a pair of clock terminals for receiving the positive and negative portions, respectively.

3. The dual-edge sampler of claim 1 wherein the output signal is a differential output signal having a positive portion and a negative portion, and the output terminal is a pair of output terminals for receiving the positive and negative portions, respectively.

4. The dual-edge sampler of claim 1 wherein the asynchronous level mode state machine comprises a differential logic block for generating an intermediate result responsive to current state information and the data signal.

5. The dual-edge sampler of claim 4 wherein the asynchronous level mode state machine further comprises a logic block for generating next state information responsive to the clock signal and the intermediate result.

6. The dual-edge sampler of claim 5 wherein the output signal provided by the output terminal toggles if an asserted data signal is sampled.

7. The dual-edge sampler of claim 4 wherein the differential logic block is a first differential logic block for generating a first intermediate result, the asynchronous level mode state machine further comprising a second differential logic block for generating a second intermediate result responsive to the current state information and the data signal.

8. The dual-edge sampler of claim 7 wherein the asynchronous level mode state machine further comprises a logic block for generating next state information responsive to the clock signal and the first and second intermediate results.

9. The dual-edge sampler of claim 7 wherein the first and second differential logic blocks comprise differential cascode voltage switch logic (DCVSL).

10. The dual-edge sampler of claim 7 wherein the logic block comprises single-ended logic.

11. The dual-edge sampler of claim 1 wherein the edge control circuit comprises logic for gating the data signal with one of the clock signal and a complement of the clock signal responsive to the edge control signal.

12. The dual-edge sampler of claim 1 wherein the asynchronous level mode state machine is optimized to stop further sampling after sampling an asserted data signal.

13. The dual-edge sampler of claim 12 further comprising a reset terminal for receiving a reset signal for resetting the asynchronous level mode state machine to a known state.

14. An integrated circuit comprising:
    a data signal;
    a clock signal;
    a dual-edge sampler, the dual-edge sampler comprising:
        a clock terminal for receiving the clock signal;
        a data input terminal for receiving the data signal;
        an output terminal for providing an output signal; and
        an asynchronous level mode state machine configured to sample the data signal at every rising and falling edge of the clock signal and provide sampled data as the output signal;
    a circuit for receiving and processing the output signal;
    an edge control circuit for selectively configuring the dual-edge sampler as a rising edge or falling edge triggered sampler responsive to an edge control signal.

15. The integrated circuit of claim 14 wherein the data signal is a double data rate data signal.

16. The integrated circuit of claim 14 further comprising a memory cell for storing the edge control signal.

17. The integrated circuit of claim 14 wherein the circuit for receiving and processing the output signal comprises programmable logic.

18. The integrated circuit of claim 14 wherein the integrated circuit is a programmable logic device.

* * * * *